(12) United States Patent
Duthou (10) Patent No.: US 7,793,247 B1
(45) Date of Patent: Sep. 7, 2010

(54) METHOD AND APPARATUS FOR DIRECTED PHYSICAL IMPLEMENTATION OF A CIRCUIT DESIGN FOR AN INTEGRATED CIRCUIT

(75) Inventor: Arnaud Duthou, Grenoble (FR)

(73) Assignee: Xilinx, Inc., San Jose, CA (US)

( * ) Notice: Subject to any disclaimer, the term of this patent is extended or adjusted under 35 U.S.C. 154(b) by 208 days.

(21) Appl. No.: 11/818,012

(22) Filed: Jun. 13, 2007

(51) Int. Cl.
*G06F 17/50* (2006.01)
(52) U.S. Cl. ............ 716/10; 716/1; 716/6; 716/16
(58) Field of Classification Search ........ 716/5–6, 716/16–18, 1, 10
See application file for complete search history.

(56) References Cited

U.S. PATENT DOCUMENTS

| 5,521,837 | A | | 5/1996 | Frankle et al. | |
|---|---|---|---|---|---|
| 5,623,420 | A | * | 4/1997 | Yee et al. | 716/1 |
| 5,875,112 | A | * | 2/1999 | Lee | 716/12 |
| 6,453,454 | B1 | * | 9/2002 | Lee et al. | 716/11 |
| 6,490,717 | B1 | * | 12/2002 | Pedersen et al. | 716/18 |
| 7,111,269 | B2 | * | 9/2006 | Satapathy et al. | 716/11 |
| 7,124,391 | B1 | | 10/2006 | Patterson | |
| 7,194,722 | B1 | | 3/2007 | Abid et al. | |
| 7,224,184 | B1 | | 5/2007 | Levi et al. | |
| 7,254,801 | B1 | * | 8/2007 | Borer et al. | 716/16 |
| 7,257,800 | B1 | * | 8/2007 | Singh et al. | 716/16 |
| 7,277,902 | B2 | | 10/2007 | Park et al. | |
| 7,337,100 | B1 | | 2/2008 | Hutton et al. | |
| 7,380,232 | B1 | | 5/2008 | Schumacher et al. | |
| 7,415,682 | B2 | | 8/2008 | Padalia et al. | |
| 7,478,357 | B1 | | 1/2009 | Mason et al. | |
| 7,634,743 | B1 | * | 12/2009 | Ginetti | 716/1 |
| 2002/0023252 | A1 | * | 2/2002 | Lee et al. | 716/6 |
| 2006/0236293 | A1 | | 10/2006 | Park et al. | |
| 2007/0226667 | A1 | | 9/2007 | Chadwick et al. | |

OTHER PUBLICATIONS

U.S. Appl. No. 11/494,642, filed Jul. 27, 2006, by Duthou, Arnaud, et al., "Method and Apparatus for Directed Physical Implementation of a Circuit Design for an Integrated Circuit" 24 pages, available from Xilinx, Inc., 2100 Logic Drive, San Jose, CA 95124.

\* cited by examiner

*Primary Examiner*—Jack Chiang
*Assistant Examiner*—Patrick Sandoval
(74) *Attorney, Agent, or Firm*—Robert M. Brush; LeRoy D. Maunu (57) ABSTRACT

Method, apparatus, and computer readable medium for directed physical implementation of a circuit design for an integrated circuit is described. One aspect of the invention relates to implementing a circuit design for an integrated circuit. Matching elements between an original version of the circuit design and a modified version of the circuit design are identified. The original version includes an original implementation. The modified version is partially placed and routed to establish a guided implementation having guided placements and guided routes for the matching elements based on placements and routes from the original implementation. Actual timing characteristics for the guided placements and the guided routes are obtained. Since the routes in the guided implementation are fully implemented, actual timing characteristics can be exactly determined. Placement and routing in the modified implementation are completed using the actual timing characteristics.

20 Claims, 5 Drawing Sheets

METHOD AND APPARATUS FOR DIRECTED PHYSICAL IMPLEMENTATION OF A CIRCUIT DESIGN FOR AN INTEGRATED CIRCUIT

FIELD OF THE INVENTION

One or more aspects of the present invention relate generally to computer aided design of electronic circuits and, more particularly, to a method and apparatus for directed physical implementation of a circuit design for an integrated circuit.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The states of the configuration memory cells define how the CLBs, IOBs, interconnect structure, and other programmable logic are configured. Some FPGAs include support for run-time partial reconfiguration, which provides the ability to alter the behavior of portions of a circuit configured in an active FPGA. Partial reconfiguration is useful in systems that must support a wide range of optional behavior, only a subset of which is operational at any point in time.

To implement a circuit design using an FPGA, the design is synthesized and mapped onto programmable logic blocks, placed within the FPGA, and routed using the programmable fabric. The place and route phases of implementing a circuit design involve generating a layout of the circuit elements on the FPGA and defining the signal lines (routing resources) that connect the elements. It is often necessary to modify a design after the design is physically implemented. The current techniques to implement small changes to a design are inefficient both in terms of CPU runtime and in the quality of the results. For example, after making a change to a design, a designer may completely re-implement the design from scratch. Such a technique, however, is not runtime efficient. Alternatively, a designer may employ strict guiding methods that may improve runtime, but often provides results of poor quality. Accordingly, there exists a need in the art for an improved method and apparatus for implementing a modified version of a previously implemented circuit design.

SUMMARY OF THE INVENTION

Embodiments of the present invention provide an improved method and apparatus for implementing a modified version of a previously implemented circuit design in a Programmable Logic device. Embodiments preserve runtime efficiency while also providing a high quality implementation.

A method, apparatus, and computer readable medium for directed physical implementation of a circuit design for an integrated circuit is described. One aspect of the invention relates to implementing a circuit design for an integrated circuit. Matching elements between an original version of the circuit design and a modified version of the circuit design are identified. The original version includes an original implementation. The modified version is partially placed and routed to establish a guided implementation having guided placements and guided routes for the matching elements based on placements and routes from the original implementation. Actual timing characteristics for the guided placements and the guided routes are obtained. In one embodiment, the actual timing characteristics are determined from timing analysis of the guided implementation. Since the routes in the guided implementation are fully implemented, actual timing characteristics can be exactly determined. Placement and routing of the modified version are completed using the actual timing characteristics.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for directed physical implementation of a circuit design for an integrated circuit is described. One or more aspects of the invention are described with respect to implementing a circuit design for a field programmable gate array (FPGA). Those skilled in the art will appreciate that the invention may be adapted to implement a circuit design for other types of integrated circuits, such as application specific integrated circuits (ASICs), complex programmable logic devices (CPLDs), and the like.

Figure 1:
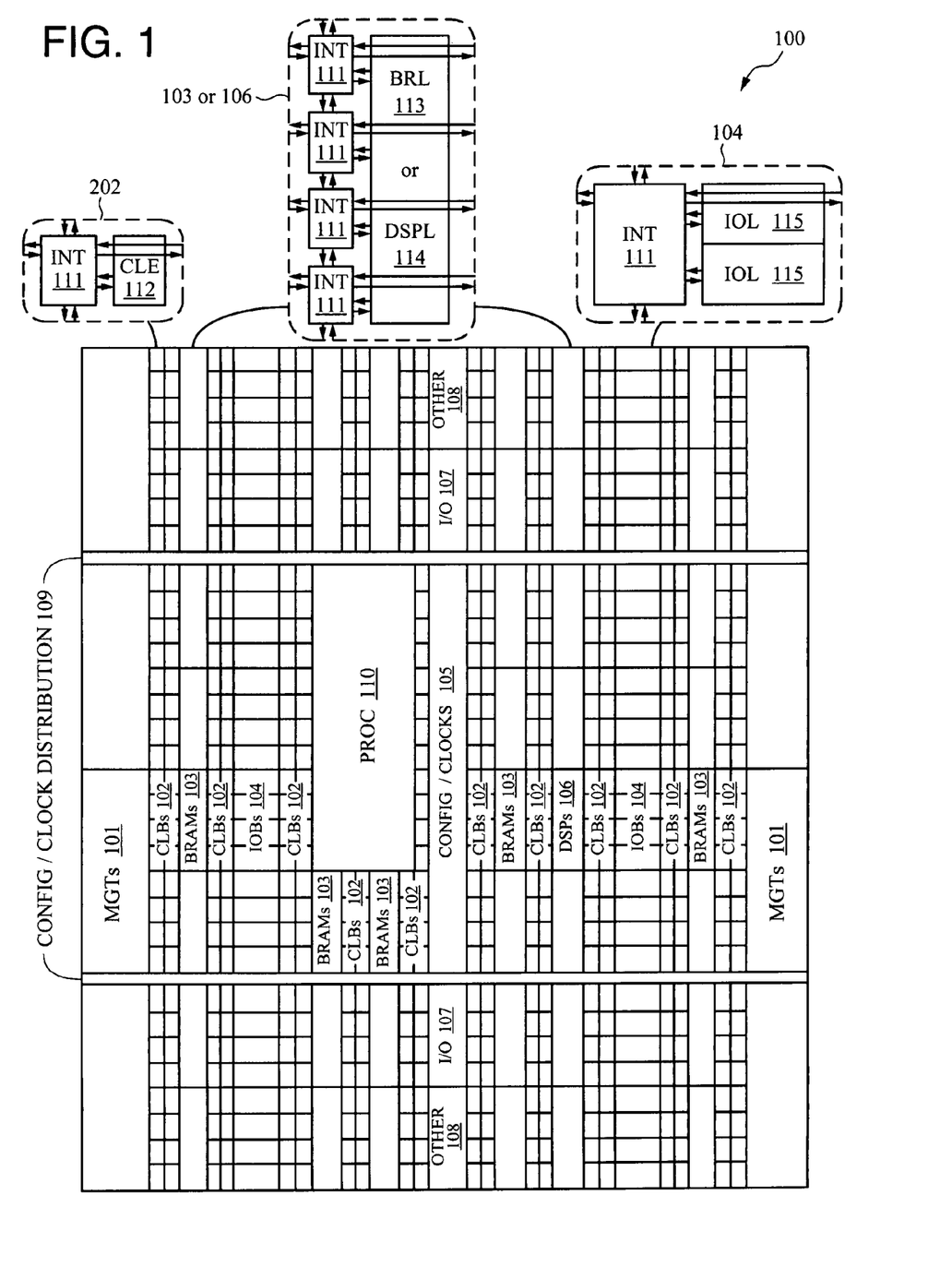
FIG. 1 illustrates an exemplary FPGA architecture.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (120 in FIG. 1) is used for configuration, clock, and other control logic. Horizontal areas 109 extending from this column are used to distribute the clocks and configuration signals across the breadth of the FPGA. Configuration information for the programmable logic is stored in configuration memory (not shown). The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
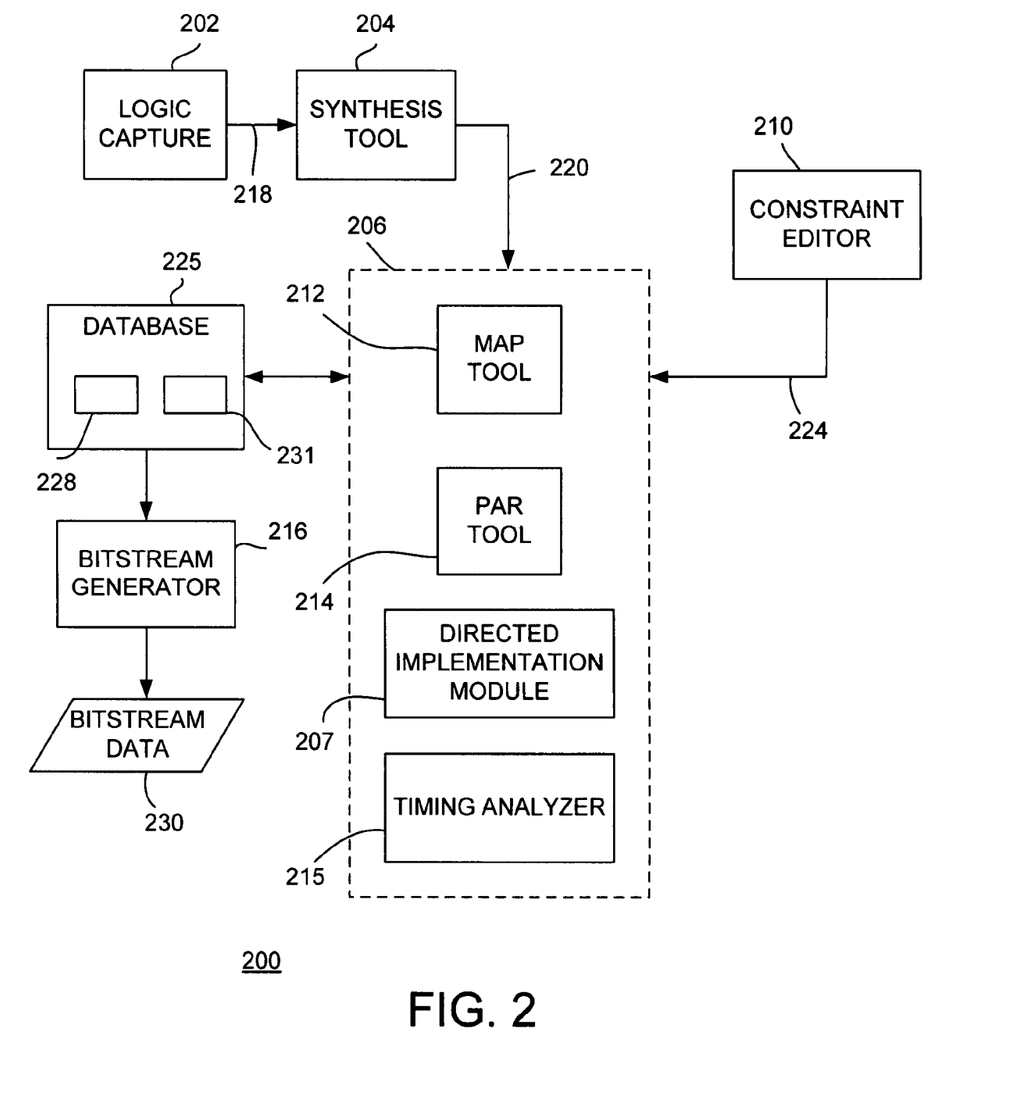
FIG. 2 is a block diagram depicting an exemplary embodiment of a logic design system for a programmable logic device (PLD) in accordance with one or more aspects of the invention.

FIG. 2 is a block diagram depicting an exemplary embodiment of a logic design system 200 for a programmable logic device (PLD) in accordance with one or more aspects of the invention. The system 200 includes a logic capture tool 202, a synthesis tool 204, a constraint editor 210, an implementation tool 206, and a bitstream generator 216. In the present embodiment, the system 200 is configured to implement a logic design using a target FPGA. Accordingly, the implementation tool 206 includes a map tool 212, a place-and-route (PAR) tool 214, and a timing analysis tool 215. The system 200 may be implemented using the computer 400 of FIG. 4 and described below. Notably, the tools may be part of one or more software programs stored in a memory and configured for execution by a central processing unit (CPU).

One or more aspects of the invention relate to directed physical implementation of a circuit design for an FPGA using a previously implemented version of the design. The system 200 is configured to leverage results of implementation of a previous version of the design to generate a new implementation with an equivalent quality of result with a shorter processing runtime. For purposes of clarity by example, the logic design system 200 is described immediately below with respect to a logic design in general. Features of the design system 200 specifically pertaining to directed physical implementation are described thereafter.

In particular, the logic capture tool 202 is configured to capture a circuit design from a user and generate a behavioral description 218 of the circuit design. The behavioral description 218 includes a plurality of circuit components, such as flip-flops, memories, gates, LUTs, and the like, connected together via signal conductors (nets). The logic capture tool 202 may include a graphic interface through which a designer connects symbols and blocks representing various components to produce a schematic description of the circuit design. The logic capture tool 202 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 204 is configured to receive the behavioral description 218. The synthesis tool 204 processes the behavioral description 218 to produce a logical description 220 of the circuit design. The logical description 220 includes a logical network list ("netlist") of lower-level circuit elements and logic gates, as well as connections (nets) between inputs and outputs thereof, in terms of the hierarchy specified in the behavioral description 218. For example, the logical description 220 may be compliant with the Electronic Design Interchange Format (EDIF). The synthesis tool 204 may also generate constraint data associated with the logical description 220 that includes various timing and layout constraints. Alternatively, the logical description 220 may be annotated with constraint data. Such an annotated netlist is produced by XST synthesis tool, commercially availably by Xilinx, Inc., of San Jose, Calif.

A designer may use the constraint editor 210 to produce constraint data 224 having various constraints, such as PERIOD constraints (i.e., the time between rising edges of a clock signal) for all clocks, as well as input/output (10) timing constraints (time between two pins, typically measured from a clock input at a first pin and data out at a second pin) for IOs, placement constraints (e.g., positions and ranges of logic blocks), and the like.

The implementation tool 206 is configured to receive the logical description 220 and the constraint data 224. The map tool 212 maps the logical description 220 onto physical resources within the target FPGA (i.e., the circuit components, logic gates, and signals are mapped onto LUTs, flip-flops, clock buffers, I/O pads, and the like of the target FPGA). The map tool 212 produces a mapped circuit description 226 in accordance with any constraints in the constraint data 224. The mapped circuit description 226 includes groupings of the physical resources of the target FPGA expressed in terms of CLBs and IOBs, and other physical resources of the FPGA.

The PAR tool 214 determines placement for the physical resource groupings of the mapped circuit description 226 in the target FPGA and apportions the appropriate routing resources. The PAR tool 214 performs such placement and routing in accordance with any constraints in the constraint data 224. The PAR tool 214 produces physical design data (e.g., a placed and routed netlist), which is stored in a database 225. The bitstream generator 216 is configured to obtain physical design data from the database 225 and produce bitstream data 230 for the target FPGA.

The timing analysis tool 215 is configured to perform static timing analysis on the design. Timing analysis may be performed after mapping, placing, and routing the design. The timing analysis tool 215 is configured to report delays for particular paths and slack values based on specified timing requirements. Output of the timing analysis tool 215 may be used to identify critical paths in the design.

In one embodiment of the invention, the design system 200 is utilized to generate a first behavioral description of a circuit design and corresponding first physical design data. This first behavioral description is referred to as the "original version" of the circuit design, and the corresponding first physical design data is referred to as the "original" implementation of the circuit design. The original implementation comprises an original netlist 228, which has already been implemented (i.e., mapped, placed, and routed).

A second behavioral description is then produced, which represents a modified version of the circuit design (e.g., elements and/or connections in the circuit design may be removed, added, or otherwise modified from the original version). The implementation tool 206 is configured to receive a logical description (e.g., netlist) representing the modified version of the circuit design. The modified version comprises a modified netlist 231 (illustratively shown as being stored in the database 225). Initially, the modified netlist 231 is not implemented (i.e., is un-placed and un-routed). The implementation tool 206 implements the modified netlist 231 using directed physical implementation based on the implemented netlist 228 corresponding to the original version of the design. The implementation tool 206 obtains the original netlist 228 and the timing data 217 from the database 225.

In particular, the implementation tool 206 may include a directed implementation module 207 for initiating and controlling directed physical implementation. Those skilled in the art will appreciate that the functions performed by the directed implementation module 207 described below may be incorporated into the MAP tool 212 and/or PAR tool 214, rather than in a separate module as shown. The directed implementation module 207 is configured to identify matching circuit elements between the modified version and the original version of the circuit design. For example, a netlist for the modified version (generated by the synthesis tool 204) may be compared with the implemented netlist for the original version. An element having the same "name" (e.g., identifier) in both netlists may be deemed as being matching elements.

The directed implementation module 207 is configured to partially place and route the modified netlist 231 based on the original netlist 228. For the matching elements, placements are obtained form the original netlist 228 and copied for the modified netlist 231. That is, the matching elements are placed in the modified netlist 231 in the same location as they were in the original netlist 228. The copied placements are referred to as "guided placements." For elements in the modified netlist 231 other than the matching elements ("non-matching elements"), no placements are established. In addition, for each route in the original netlist 228 that has source and load elements identically placed in the modified netlist 231, routes are obtained from the original netlist 228 and copies for the modified netlist 231. That is, connections between matching elements are routed in the modified netlist 231 in the same manner as they were in the original netlist 228, as long as the placements of source and load for the connections are identical between the two netlists. The copied routes are referred to as "guided routes." For the non-matching elements in the modified netlist 231, no associated connections are routed.

The modified netlist 231 as partially placed and routed is then passed to the PAR tool 214. Since the modified netlist 231 is partially placed and routed, the PAR tool 214 does not have to perform as much work as for a totally un-placed and un-routed netlist. Therefore, runtime of the PAR tool 214 is decreased. In particular, the PAR tool 214 uses a combination of weak and strong locks on element placement, which provides a compromise between runtime gain and general timing performance. The PAR tool 214 may initially consider the guided placements as "weak locks." A weak lock is a recommended placement, but such a recommended placement may be changed if the PAR tool 214 finds a more suitable location.

The PAR tool 214 must place the new elements in the modified netlist 231 to meet the applicable timing constraints. Thus, during the placement process, the PAR tool 214 obtains signal delays for routes between placed elements to identify timing critical connections. The criticality of a connection can be measured by the "slack" thereof. Slack is the difference between the time a signal is to arrive at a particular destination to meet established design constraints and the actual time, or estimated time as determined by a design tool, at which the signal arrives. The more negative the slack, the more critical both the connection and the elements associated with that connection. Criticality is determined by comparing the slack values to a threshold value. If slack of a connection is greater than the threshold, then the element(s) associated therewith is/are classified as being non-critical. Otherwise, the element(s) is/are classified as being critical.

During placement, the PAR tool 214 applies a "strong lock" to each element other than the timing-critical elements. A strong lock on an element indicates that the change of placement cannot be initiated by itself. An element having a strong lock will maintain its position in the final placement, unless its position was swapped by a timing critical element. Notably, some or all of the elements previously having a weak lock are transformed into strong locked elements. If an element having a weak lock is deemed non-critical, then the weak lock is transformed into a strong lock. Furthermore, some elements having weak locks may receive strong locks regardless of their criticality. For example, if an element having a weak lock represents a clock or an IOB element, then the weak lock may be transformed into a strong lock. Note that some weakly locked elements may not receive a strong lock (e.g., some weakly locked elements may be deemed timing critical).

The PAR tool 214 is configured to generate an optimized placement for the modified netlist 231. The non-critical elements are placed in accordance with their strong locks, and the timing-critical elements are placed in a manner that seeks to minimize critical connections between components. In some cases, the PAR tool 214 may not be able to meet timing constraints given the strong locked elements. In such a case, one or more of the strong locked elements may be "unlocked." That is, strong locks(s) may be removed so that the corresponding element(s) can be moved along with the critical-elements.

In one embodiment, the PAR tool 214 uses actual timing characteristics associated with the guided placements and the guided routes during placement. The actual timing characteristics can be determined exactly, since the matching elements are completely placed and routed. Moreover, since the matching elements are in exactly the same configuration as in the original netlist 228, their timing characteristics in the modified netlist 231 will be the same or similar to their timing characteristics in the original netlist 228. Exemplary timing characteristics that can be determined include signal delays for the routes. The timing characteristics may be determined by the PAR tool 214 or by the timing analyzer 215. For the guided placements and guided routes in the modified netlist 231, timing performance will be preserved, allowing the use of the actual signal delays in the placement process. The actual signal delays provide for more accurate determination of timing critical paths and allows placement to converge more efficiently than when using only estimated delays. Since not all of the routes in the modified netlist 231 are guided routes (due to changes in the netlist from the original), the PAR tool 214 still must compute estimated signal delays for connections between elements that do not have guided placements. In addition, if the PAR tool 214 has to move some of the elements from their guided placements (e.g., to meet timing requirements), then the corresponding guided routes are invalidated and delay estimation is used to estimate delays for those connections.

Typically, a PAR tool does not have routing information available for a netlist to compute the exact delays of connections. Thus, the PAR tool uses a delay estimator that provides estimated delays of connections between elements during placement. Accurate delay estimators are difficult to create, as they have to provide results for diverse configurations in a limited amount of time (so as to not penalize runtime). The PAR tool 214, however, is configured to use actual delay information for routes that are completely implemented (as copied from the original version of the design). By using the actual delays for these routes, the PAR tool 214 guarantees exact measurements of the signal delays, which leads to higher quality results. Typically, a large number of signal delays will be actual signal delays for the guided routes (the smaller the changes compared to the original design, the more guided routes there are). The PAR tool 214 is able to generate a more efficient placement due use of the actual signal delays.

The PAR tool 214 also achieves routing using a similar mechanism. The modified netlist 231 already includes guided routes. Thus, the PAR tool 214 only has to operate on un-guided routes, which saves runtime of the routing process. In addition, the PAR tool 214 is aware of the available routing resources (i.e., those not used by the guided routes), which limits the space of solution the PAR tool 214 must explore. The routing process also uses the actual signal delay information for the guided routes when determining timing criticality. Similar to the placement process, if a connection is too critical and cannot achieve timing with the current configuration, or if a guided route uses resources necessary for another connection, the PAR tool 214 is configured to invalidate the guided route. The PAR tool 214 then either re-routes this connection differently so that it meets timing requirements or free up some routing resources to route a more critical connection.

Using the actual timing characteristics for the routes copied from the original netlist 228, the implementation tool 206 will be able to optimize the most critical part of the circuit design resulting in a suitable quality of result, while improving runtime. The inventors have found that the invention provides an average 40% gain in runtime (up to 75%) and a good preservation of the original implementation (up to 85% of the original placement and routes), as compared to a non-directed technique (e.g., starting the implementation of the modified version from scratch).

Figure 3:
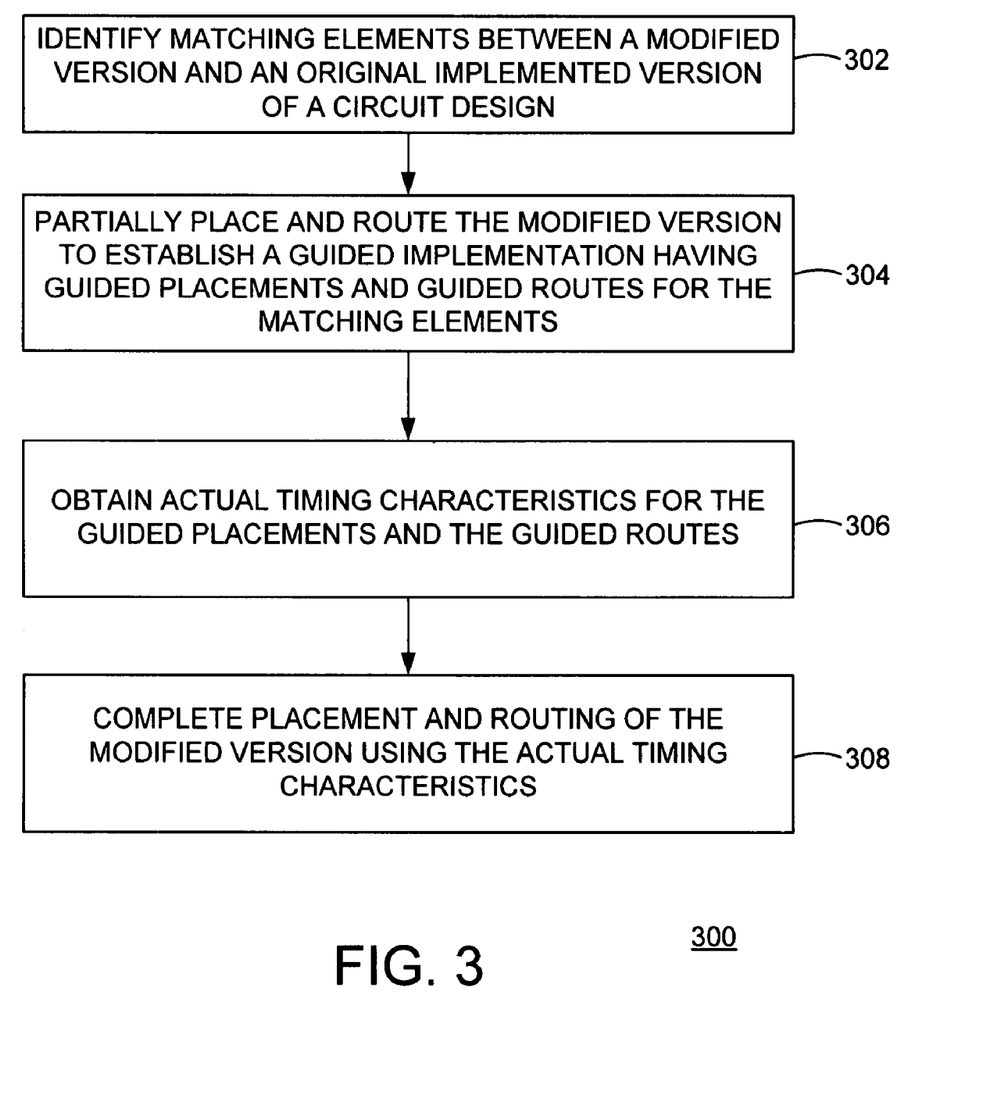
FIG. 3 is a flow diagram depicting an exemplary embodiment of a method for implementing a circuit design for an integrated circuit in accordance with one or more aspects of the invention.

FIG. 3 is a flow diagram depicting an exemplary embodiment of a method 300 for implementing a circuit design for an integrated circuit in accordance with one or more aspects of the invention. The method 300 begins at step 301. At step 302, matching elements between a modified version and an original (implemented) version of a circuit design are identified. For example, an implemented netlist for the original version and a modified netlist for the modified version may be obtained and compared. Elements that are present in both netlists may be designed are matching elements.

At step 304, the modified version is partially placed and routed to establish a guided implementation having guided placements and guided routes for the matching elements. The guided placements and the guided routes are based on placements and routes from the original implementation for the matching elements. For example, a placement in the original implementation may be identified for each of the matching elements. The identified placements are then copied to the modified implementation to establish the guided placements. Each route in the original implementation having source and load elements identically placed in the modified implementation is also identified. The identified routes are copied to the modified implementation to establish the guided routes.

At step 306, actual timing characteristics are obtained for the guided placements and the guided routes. Since the guided placements and routes are fully implemented, the timing characteristics thereof will be the same or similar to the timing characteristics from the original implementation. The actual timing characteristics may include actual signal delays for the guide routes as determined by static timing analysis, for example. At step 308, placement and routing of the modified version is completed using the actual timing characteristics. The elements of the modified netlist are placed and routed using the guided placements, guided routes, actual signal delays, and estimated signal delays for estimated routes associated with elements other than the matching elements. The method 300 ends at step 308.

Figure 4:
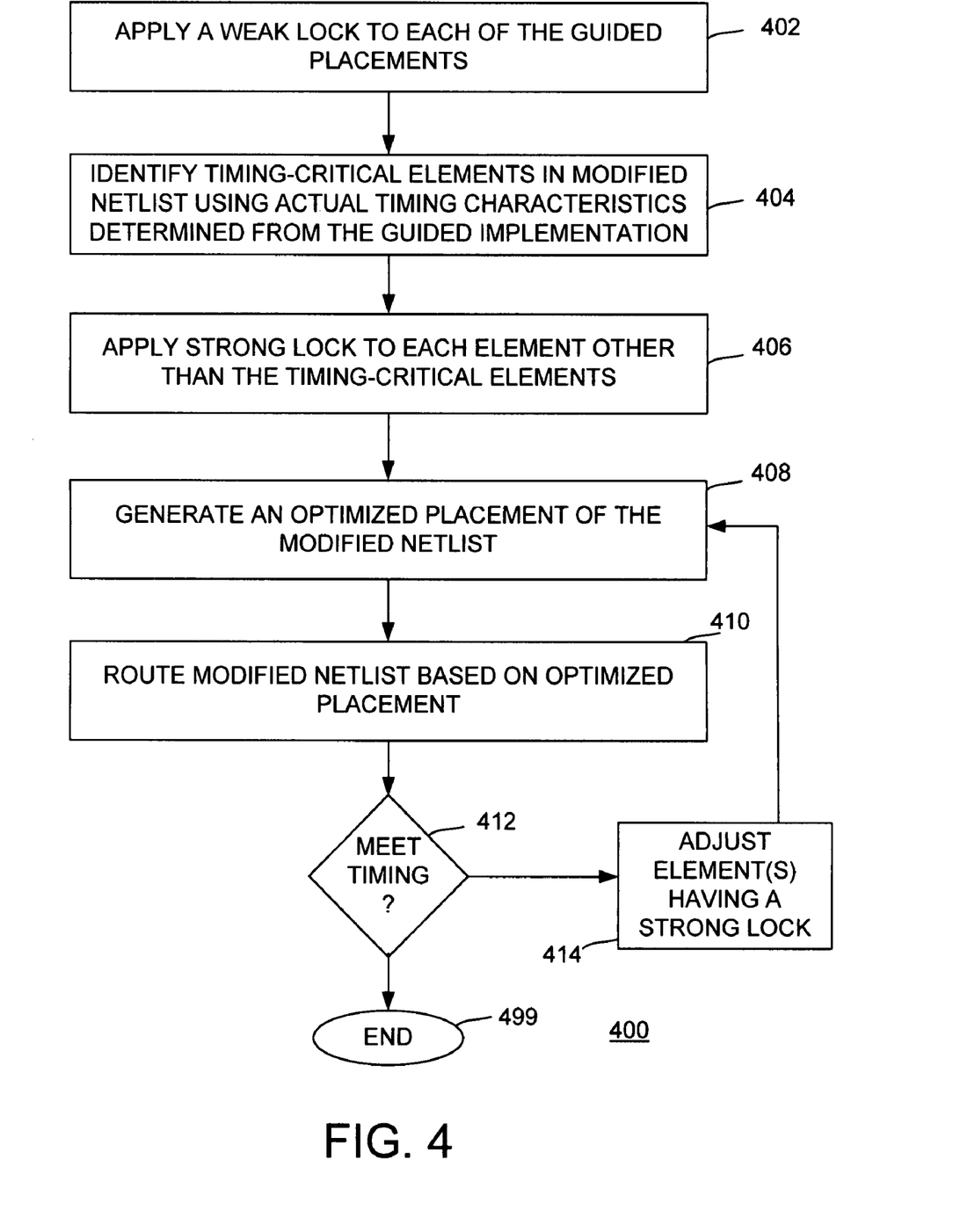
FIG. 4 is a flow diagram depicting an exemplary embodiment of a placement and routing process performed in the method of FIG. 3 in accordance with one or more aspects of the invention.

FIG. 4 is a flow diagram depicting an exemplary embodiment of a placement and routing process 400 performed at step 308 of FIG. 3 in accordance with one or more aspects of the invention. The process 400 begins at step 402, where a weak lock is applied to each of the guided placements. That is, recommended placements are established for the matching elements base on the guided placements. At step 404, timing-critical elements in the modified netlist are identified using the actual timing characteristics determined from the guided implementation (guided placements and guided routes). In one embodiment, slack values of connections are determined. For guided routes, the actual signal delays from the guided implementation are used. For non-guided routes, estimated signal delays are computed. The slack values are compared to a threshold slack value. Any element having a slack value that does not satisfy the threshold is deemed as being timing-critical.

At step 406, a strong lock is applied to each element other than the timing critical elements (i.e., the elements that are not deemed timing critical). In some cases, for the matching elements that are not identified as being timing critical, the weak locks are transformed into strong locks. For the matching elements that are representative of clocks or IOBs, the weak locks are transformed in to strong locks. A strong lock is not applied to any element that is deemed to be timing critical.

At step 408, an optimized placement of the modified version is generated. The placement of the timing-critical elements is optimized while trying to maintain the locations of strongly locked elements. The timing-critical elements are placed in a manner that seeks to minimize critical connections between components. The optimized placement is generated using actual signal delays for the guided routes and estimated signal delays for un-guided routes. If any of the guided placements required re-placement, the guided route(s) associated therewith are invalidated. At step 410, the modified netlist is routed based on the optimized placement. Again, the routing process uses actual signal delays for the guided routes and estimated signal delays for un-guided routes. At step 412, a determination is made whether the placed and routed implementation of the modified netlist meets timing constraints. If so, the method 400 ends at step 499. Otherwise, the method 400 proceeds to step 414, where one or more elements having a strong lock are adjusted to remove the strong lock. The method 400 returns to step 412 and repeats until timing is met.

Figure 5:
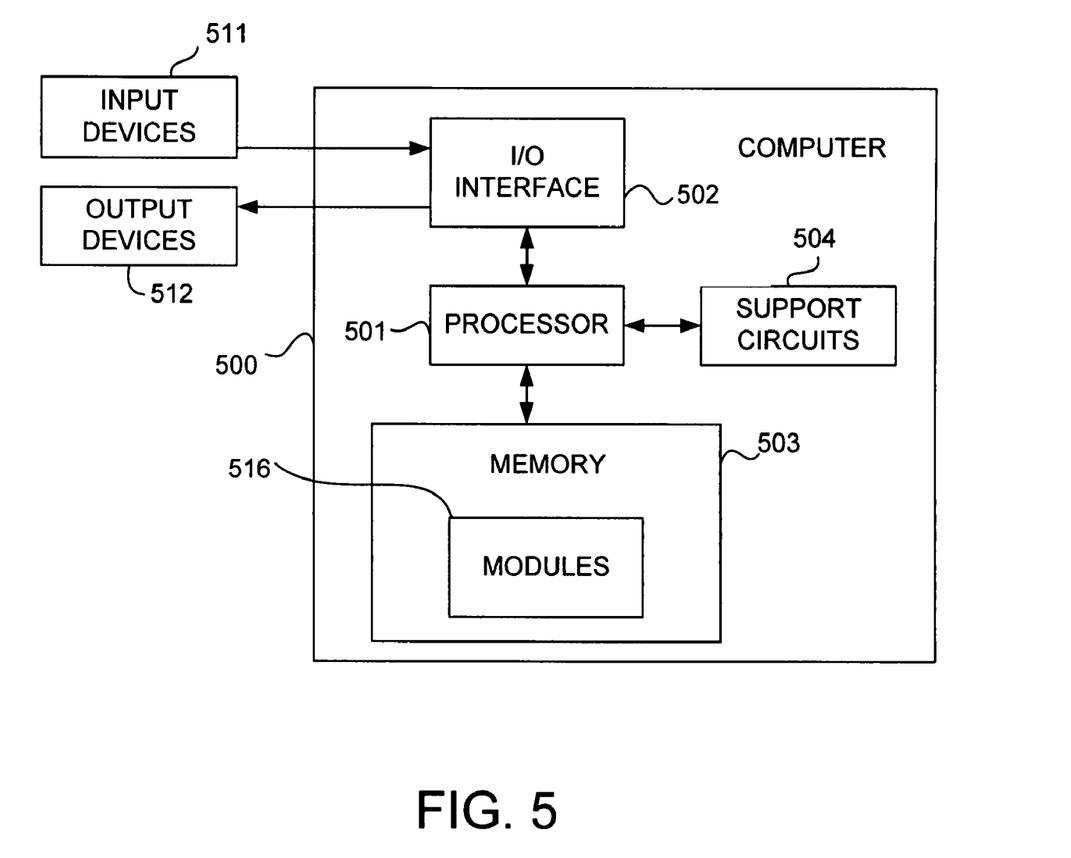
FIG. 5 is a block diagram depicting an exemplary embodiment of a computer suitable for implementing the processes and methods described herein.

FIG. 5 is a block diagram depicting an exemplary embodiment of a computer 500 suitable for implementing the processes and methods described herein. For example, the computer 500 may be used to implement the system 200 of FIG. 2, as well as the methods 300 and 400 of FIGS. 3 and 4. The computer 500 includes a processor 501, a memory 503, various support circuits 504, and an I/O interface 502. The processor 501 may include one or more microprocessors known in the art. The support circuits 504 for the processor 501 include conventional cache, power supplies, clock circuits, data registers, I/O interfaces, and the like. The I/O interface 502 may be directly coupled to the memory 503 or coupled through the processor 501. The I/O interface 502 may also be configured for communication with input devices 511 and/or output devices 512, such as, network devices, various storage devices, mouse, keyboard, display, and the like.

The memory 503 stores processor-executable instructions and/or data that may be executed by and/or used by the processor 201. These processor-executable instructions may comprise hardware, firmware, software, and the like, or some combination thereof. The memory 503 may store modules 516 for implementing the design system 200 and the processes 300 and 400. The computer 500 may be programmed with an operating system, which may include OS/2, Java Virtual Machine, Linux, Solaris, Unix, HPUX, AIX, Windows, Windows95, Windows98, Windows NT, and Windows2000, WindowsME, WindowsXP, Windows Server, among other known platforms. At least a portion of the operating system may be disposed in the memory 503. The memory 503 may include one or more of the following random access memory, read only memory, magneto-resistive read/write memory, optical read/write memory, cache memory, magnetic read/write memory, and the like.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A computer-implemented method of implementing a circuit design for an integrated circuit, comprising:

identifying, using a computer, matching elements and non-matching elements between an original version of the circuit design and a modified version of the circuit design, the original version having an original implementation;

partially placing and routing the modified version to establish a guided implementation having guided placements and guided routes for the matching elements copied from placements and routes from the original implementation;

obtaining actual timing characteristics for the guided placements and the guided routes;

before placing and routing the non-matching elements, determining timing-critical ones of the matching elements in the modified version using the actual timing characteristics;

wherein, whether or not a matching element is determined to be timing critical controls whether a weak lock or a strong lock is applied to the matching element;

before placing and routing the non-matching elements of the modified version, applying a weak lock to each of the matching elements, wherein placement of a matching element having a weak lock is recommended, but changeable if another location is determined to reduce signal delays during placing and routing of the of the non-matching elements;

after determining the timing-critical elements and before placing and routing the non-matching elements, applying a strong lock to the matching elements that are not timing-critical elements, wherein a weak lock of an element is transformed to strong lock if the element is identified as not timing-critical, and wherein placement of an element having a strong lock is maintained unless swapping its position with a timing-critical element would reduce signal delays; and
completing placement and routing of the modified version using the computer by initially maintaining each of the guided placements that is not one of the timing-critical elements.

2. The method of claim 1, wherein the step of identifying comprises:
obtaining an implemented netlist for the original implementation and a modified netlist for the modified version;
comparing the modified netlist with the implemented netlist; and
designating elements present in both the modified netlist and the implemented netlist as the matching elements.

3. The method of claim 1, wherein the step of partially placing and routing comprises:
identifying a placement in the original implementation for each of the matching elements; and
copying the placement of each of the matching elements as identified to the guided implementation to establish the guided placements.

4. The method of claim 3, wherein the step of partially placing and routing further comprises:
identifying each route in the original implementation having source and load elements identically placed in the guided implementation;
copying each route as identified to the guided implementation to establish the guided routes.

5. The method of claim 1, wherein the actual timing characteristics include actual signal delays for the guided routes based on timing analysis of the guided implementation.

6. The method of claim 5, wherein the step of completing placement and routing comprises:
placing and routing elements in the modified version using the guided placements, the guided routes, the actual signal delays, and estimated signal delays for estimated routes associated with the elements other than the matching elements.

7. The method of claim 6, wherein the step of completing placement and routing further comprises:
moving at least one of the guided placements; and
invalidating at least one of the guided routes associated with the at least one of the guided placements.

8. Apparatus for implementing a circuit design for an integrated circuit, comprising:
means for identifying matching elements and non-matching elements between an original version of the circuit design and a modified version of the circuit design, the original version having an original implementation;
means for partially placing and routing the modified version to establish a guided implementation having guided placements and guided routes for the matching elements copied from placements and routes from the original implementation;
means for obtaining actual timing characteristics for the guided placements and the guided routes;
means for determining, before placing and routing the non-matching elements, timing-critical ones of the matching elements in the modified version using the actual timing characteristics;
wherein, whether or not a matching element is determined to be timing critical controls whether a weak lock or a strong lock is applied to the matching element;
means for applying, before placing and routing the non-matching elements of the modified version, a weak lock to each of the matching elements, wherein placement of a matching element having a weak lock is recommended, but changeable if another location is determined to reduce signal delays during placing and routing of the of the non-matching elements;
means for applying, after determining the-timing critical elements and before placing and routing the non-matching elements, a strong lock to the matching elements that are not timing critical elements, wherein a weak lock of an element is transformed to strong lock if the element is identified as not timing-critical, and wherein placement of an element having a strong lock is maintained unless swapping its position with a timing-critical element would reduce signal delays; and
means for completing placement and routing of the modified version by initially maintaining each of the guided placements that is not one of the timing-critical elements.

9. The apparatus of claim 8, wherein the means for identifying comprises:
means for obtaining an implemented netlist for the original implementation and a modified netlist for the modified version;
means for comparing the modified netlist with the implemented netlist; and
means for designating elements present in both the modified netlist and the implemented netlist as the matching elements.

10. The apparatus of claim 8, wherein the means for partially placing and routing comprises:
means for identifying a placement in the original implementation for each of the matching elements; and
means for copying the placement of each of the matching elements as identified to the guided implementation to establish the guided placements.

11. The apparatus of claim 10, wherein the means for partially placing and routing further comprises:
means for identifying each route in the original implementation having source and load elements identically placed in the guided implementation;
means for copying each route as identified to the guided implementation to establish the guided routes.

12. The apparatus of claim 8, wherein the actual timing characteristics include actual signal delays for the guided routes based on timing analysis of the guided implementation, and wherein the means for completing placement and routing comprises:
means for placing and routing elements in the modified version using the guided placements, the guided routes, the actual signal delays, and estimated signal delays for estimated routes associated with the elements other than the matching elements.

13. The apparatus of claim 12, wherein the means for completing placement and routing further comprises:
means for moving at least one of the guided placements; and
means for invalidating at least one of the guided routes associated with the at least one of the guided placements.

14. A non-transitory computer readable medium having stored thereon instructions that when executed by a processor cause the processor to perform a method of a method of implementing a circuit design for an integrated circuit, comprising:
identifying matching elements and non-matching elements between an original version of the circuit design and a modified version of the circuit design, the original version having an original implementation;

partially placing and routing the modified version to establish a guided implementation having guided placements and guided routes for the matching elements copied from placements and routes from the original implementation;

obtaining actual timing characteristics for the guided placements and the guided routes;

before placing and routing the non-matching elements, determining timing-critical ones of the matching elements in the modified version using the actual timing characteristics;

wherein, whether or not a matching element is determined to be timing critical controls whether a weak lock or a strong lock is applied to the matching element;

before placing and routing the non-matching elements of the modified version, applying a weak lock to each of the matching elements, wherein placement of a matching element having a weak lock is recommended, but changeable if another location is determined to reduce signal delays during placing and routing of the of the non-matching elements;

after determining the timing-critical elements and before placing and routing the non-matching elements, applying a strong lock to the matching elements that are not timing critical elements, wherein a weak lock of an element is transformed to strong lock if the element is identified as not timing-critical, and wherein placement of an element having a strong lock is maintained unless swapping its position with a timing-critical element would reduce signal delays; and completing placement and routing of the modified version by initially maintaining each of the guided placements that is not one of the timing-critical elements.

15. The computer readable medium of claim 14, wherein the step of identifying comprises:

obtaining an implemented netlist for the original implementation and a modified netlist for the modified version;

comparing the modified netlist with the implemented netlist; and designating elements present in both the modified netlist and the implemented netlist as the matching elements.

16. The computer readable medium of claim 14, wherein the step of partially placing and routing comprises:

identifying a placement in the original implementation for each of the matching elements; and copying the placement of each of the matching elements as identified to the guided implementation to establish the guided placements.

17. The computer readable medium of claim 16, wherein the step of partially placing and routing further comprises:

identifying each route in the original implementation having source and load elements identically placed in the guided implementation;

copying each route as identified to the guided implementation to establish the guided routes.

18. The computer readable medium of claim 14, wherein the actual timing characteristics include actual signal delays for the guided routes based on timing analysis of the guided implementation.

19. The computer readable medium of claim 18, wherein the step of completing placement and routing comprises:

placing and routing elements in the modified version using the guided placements, the guided routes, the actual signal delays, and estimated signal delays for estimated routes associated with the elements other than the matching elements.

20. The computer readable medium of claim 19, wherein the step of completing placement and routing further comprises:

moving at least one of the guided placements; and code for invalidating at least one of the guided routes associated with the at least one of the guided placements.

* * * * *